United States Patent
Farooq et al.

(10) Patent No.: US 6,335,210 B1
(45) Date of Patent: Jan. 1, 2002

(54) BASEPLATE FOR CHIP BURN-IN AND/OF TESTING, AND METHOD THEREOF

(75) Inventors: Mukta S. Farooq, Hopewell Junction; Raymond A. Jackson, Fishkill; Sarah H. Knickerbocker, Hopewell Junction; Sudipta K. Ray, Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/466,607

(22) Filed: Dec. 17, 1999

(51) Int. Cl.[7] .................................................. H01L 21/66
(52) U.S. Cl. ..................... 438/15; 438/125; 438/108; 438/14
(58) Field of Search ................................ 438/14, 15, 106, 438/125, 108; 257/778; 361/728, 748

(56) References Cited
U.S. PATENT DOCUMENTS

| | | | |
|---|---|---|---|
| 5,258,648 A | * | 11/1993 | Lin |
| 5,347,162 A | | 9/1994 | Pasch |
| 5,652,696 A | * | 7/1997 | Traylor et al. |
| 5,686,842 A | | 11/1997 | Lee |
| 5,896,037 A | | 4/1999 | Kudla et al. |
| 5,929,646 A | | 7/1999 | Patel et al. |
| 5,953,816 A | | 9/1999 | Pai et al. |
| 5,973,391 A | * | 10/1999 | Bischoff et al. |
| 6,002,168 A | * | 12/1999 | Bellaar et al. |

FOREIGN PATENT DOCUMENTS

| | | |
|---|---|---|
| EP | 0 520 841 A1 | 12/1992 |
| JP | 11-121524 | 4/1999 |

\* cited by examiner

*Primary Examiner*—Charles Bowers
*Assistant Examiner*—Stephen W. Smoot
(74) *Attorney, Agent, or Firm*—Margaret A. Pepper

(57) ABSTRACT

The present invention relates generally to a new structure and method for chip burn-in and/or testing. More particularly, the invention encompasses a baseplate that is secured to a delicate chip and a method for such an invention is also disclosed. The inventive baseplate provides an added strength to a complex chip while it is being tested and/or burned-in, and then during normal use the baseplate of this invention is an integrated component of the chip.

13 Claims, 1 Drawing Sheet

1

BASEPLATE FOR CHIP BURN-IN AND/OF TESTING, AND METHOD THEREOF

FIELD OF THE INVENTION

The present invention relates generally to a new structure and method for chip burn-in and/or testing and during use in the field. More particularly, the invention encompasses a baseplate that is secured to a delicate chip and a method for such an invention is also disclosed. The inventive baseplate provides an added strength to a complex chip while it is being tested and/or burned-in, and then during normal use the baseplate of this invention is an integrated component of the chip.

BACKGROUND OF THE INVENTION

Semiconductor devices are becoming smaller and more dense with the evolution of new technology. However, increases in circuit density produce a corresponding increase in overall chip complexities. Chip manufacturers are therefore constantly challenged to improve their products. Whereas significant improvements have been made, such improvements alone are not sufficient to eliminate all the problems that effect both yield and reliability. One way to improve yield is to control process parameters. Another way to improve reliability is to test and/or burn-in every chip either before or after the dicing operation.

Historically many screening techniques have also been employed to improve yield and reliability rates to acceptable levels by culling out many of the problems associated with the manufacturing and/or processing of these semiconductor chips.

Multi-chip Modules (MCMs), particularly those with more expensive chips, require Known Good Die (KGD) for attachment. The KGD concept is well known in the art. These chips are burnt-in and/or tested on a temporary chip carrier. If they survive the burn-in and/or are tested good, they are then sorted using different criteria, such as, the speed, and are then mounted on a fully functional MCM. This way, only good chips are attached for subsequent use.

International Business Machines Corporation, Armonk, N.Y., has a TCA (temporary chip attach) process. Another process used in the industry for chip burn-in uses a very complex multilevel thin film wiring carrier with metal bumps on polyimide against which the pads on the chip are pressed to make contact during burn-in and subsequent electrical test. Both these processes require a separate carrier and additional assembly and removal of the KGDs after burn-in and/or test.

Additionally, these problems are becoming more acute for a number of reasons, such as, for example, the chip size is increasing, which is resulting in more I/O (input/output) pads, and it is becoming very difficult to remove the chip from the temporary carrier, such as, by using the shear removal method. In some cases the industry has experienced loss of KGDs due to chip cracking during the shear step to remove chips from the temporary carrier after burn-in and/or test. Additionally, some chips have failed at the internal poly/metallization levels during the chip removal process after testing and/or burn-in.

Furthermore, the method of the prior art has extra assembly and removal steps which adds to the cost. Additionally, as stated earlier the removal method can damage chips, especially the large chips or chips which have other inherent weaknesses. This invention however resolves these and other similar issues.

To prevent these and other problems, the inventors are attaching such chips to a glass ceramic baseplate which has a matched TCE (thermal coefficient of expansion) to the chip, such as, silicon, and which alleviates the problems associated with the prior art, such as, stress-cracking problems that arise due to TCE mismatch issues.

PURPOSES AND SUMMARY OF THE INVENTION

The invention is a novel structure and method for chip burn-in and/or testing.

Therefore, one purpose of this invention is to secure at least one baseplate to a thin chip.

Another purpose of this invention is to use the inventive baseplate to provide an added strength to a complex chip while it is being tested and/or burned-in.

Still another purpose of this invention is to use the baseplate of this invention as an integrated component of the chip.

Yet another purpose of this invention is to form a KGM (known good module).

Still yet another purpose of the invention is to avoid applying stress to low K, back-end-of-line (BEOL) dielectric material which typically has a modulus which is on the order of magnitude lower than traditional $SiO_2$.

Therefore, in one aspect this invention comprises a method of assembling an electronic component to a substrate, said method comprising the steps of:

(a) forming a subassembly of an electronic component joined to a baseplate;

(b) temporarily joining said subassembly to a test apparatus to test the chip;

(c) removing said subassembly from said test apparatus; and (d) joining said subassembly to a substrate if said electronic component is good.

In another aspect this invention comprises a KGM (Known Good Module) comprising at least one electronic component secured to at least one baseplate.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

In this invention, chips are mounted onto a glass ceramic baseplate during the initial process of test and/or burn-in, and then the mounted chips are left on the custom baseplate. This baseplate preferably should be a glass ceramic piece with a thermal coefficient of expansion (TCE) matched to silicon, with copper thru vias for the lowest cost applications, or alternatively it could be made with some level of X-Y wiring for high end applications, or a combination of both. KGDs can then be attached directly to the final MCM. This method prevents the use of any significant forces directly onto the chip. Once the chip is attached to the baseplate, it does not have to undergo any chip removal operations, and is mounted directly onto the desired location, such as, a substrate or a card, etc.

This invention also allows for the formation of at least one thin film capacitor that may be built directly on the baseplate for those applications where decoupling capacitance is required to be delivered close to the chip, thus providing, for example, low inductance and low parasitic capacitance.

Figure 1:
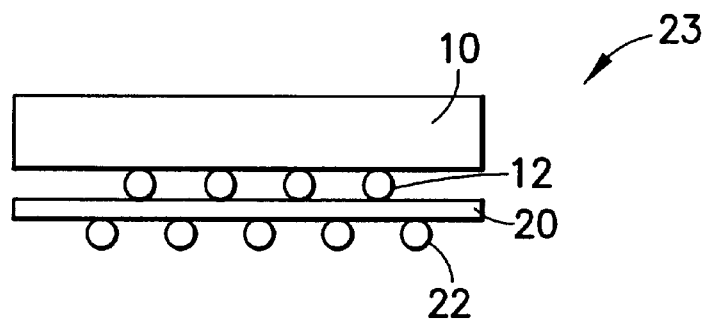
FIG. 1, illustrates a preferred embodiment of this invention where at least one electronic component is secured to at least one baseplate forming a sub-assembly prior to any burn-in and/or testing.

FIG. 1 illustrates a preferred embodiment of this invention where a sub-assembly 23 has at least one electronic component 10, such as a chip, that is secured to at least one baseplate 20 with at least one I/O connection 12 prior to any burn-in and/or testing. The baseplate 20, which acts more like a stiffener, has at least one I/O connection 22.

It is preferred that the electronic component 10 is selected from a group comprising chip, capacitor, and resistor.

It is preferred that the baseplate 20 is selected from a group consisting of ceramic, glass ceramic, and material with a TCE of about $3 \times 10^{-6}/° C$.

It is preferred that the I/O connections 12 and/or 22 are selected from a group comprising C4, solder ball, solder column, solder pad, solder connection, pin, and wire.

Figure 2:
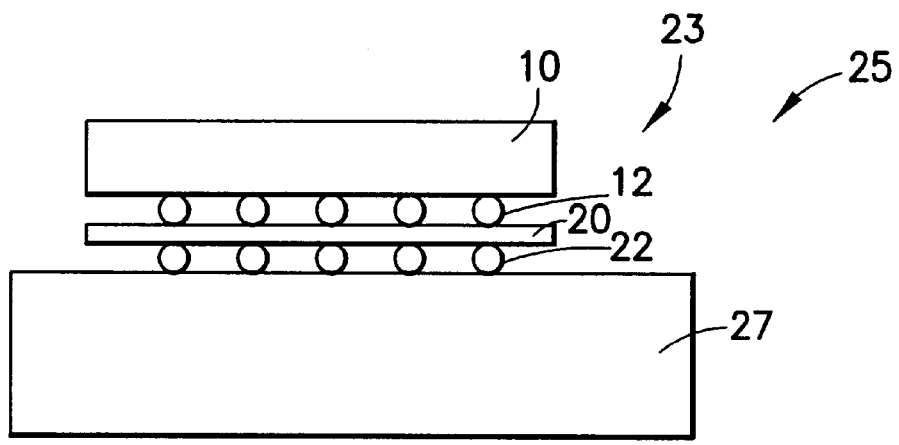
FIG. 2, illustrates a preferred embodiment of this invention where at least one electronic component after being secured to at least one baseplate and forming a sub-assembly is going through burn-in and/or testing.

FIG. 2 illustrates a preferred embodiment of this invention where at least one electronic component 10, after being secured to at least one baseplate 20 and forming a sub-assembly 23, is going through burn-in and/or testing 25 using at least one testing and/or burn-in fixture or module 27.

Figure 3:
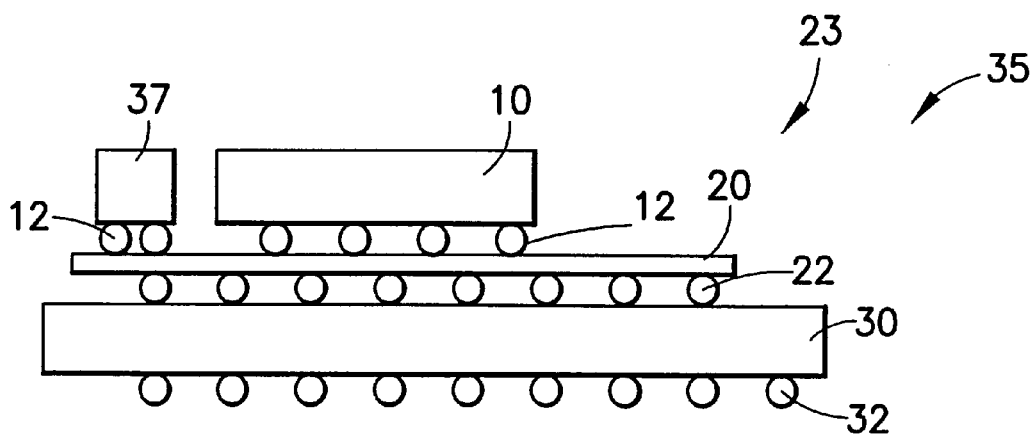
FIG. 3, illustrates a preferred embodiment of this invention where at least one electronic component after being secured to at least one baseplate forming a sub-assembly and after going through burn-in and/or testing the sub-assembly has been removed from the test and burn-in fixture and the sub-assembly secured to a substrate.

FIG. 3 illustrates a preferred embodiment of this invention where at least one electronic component 10, after being secured to at least one baseplate 20 to form the sub-assembly 23, and after going through burn-in and/or testing 25, the sub-assembly 23 has been removed from the burn-in fixture or module 27, and the sub-assembly 23 has been secured to a substrate 30 using the I/O connections 22 of the baseplate 20 to form a module 35. The module 35 could be a SCM (single chip module) or a MCM. A surface mount device 37 has been joined to the baseplate 20 and wired to the chip 10 through the base plate 20.

It should be appreciated that in this invention the sub-assembly 23 goes through the burn-in and/or test cycles, and it is the I/O connections 22 of the sub-assembly 23 that go through the shear or removal process after the burn-in and/or test cycle, as illustrated in FIG. 2. Similarly, after the test and/or burn-in process it is the I/O connections 22 that are used to secure the sub-assembly 23 to the substrate 30. Therefore, the I/O connections 12 and the electronic device 10 are only exposed to the test and/or burn-in cycle, but are not subjected to any other trauma during the process of locating a KGD and/or securing the KGD to a substrate, as shown in FIG. 3.

This invention results in a KGM (known good module) 23 which comprises at least one chip 10 secured to at least one baseplate 20, where the chip 10 and the baseplate 20 have both gone through a burn-in and/or test process and result in a module 23 that now has a KGD 10, and can now be processes as a KGD, except that now it is a KGM.

For some applications one could also have at least one second electronic device 37, such as a surface mount device, for example, a capacitor or similar other electronic device, secured to the baseplate 20 via at least one I/O connection 12, as shown in FIG. 3. However, it should be understood that the electronic device 37 can be secured to the baseplate 20 at the same time or prior to the mounting of the electronic component 10, or at any other time.

The substrate 30 typically has I/O connections 32, such as C4, solder ball, solder column, solder pad, solder connection, pins, and wires.

The baseplate 20 of this invention permits the use of low modulus, low dielectric constant materials for the back-end-of-line (BEOL) dielectric that will give enhanced electrical performance to the chip 10. Nearly all of the materials that have a lower dielectric constant than $SiO_2$ are also at least an order of magnitude weaker mechanically than traditionally used $SiO_2$. This could result in serious problems, such as wire-bond pull-outs, C4 pull outs, and C4 fatigue failures on the chip.

It is also very likely that the next generation of chips 10 will contain these weaker, lower dielectric constant material, such as using the copper metallization, which will require a glass ceramic baseplate 20 in order to provide a more reliable device.

As stated earlier, this invention addresses the chip loss problem resulting from the removal of chips that have undergone test and burn-in and those lost to fatigue of the chips BEOL structure. By mounting the chips 10 on a glass-ceramic baseplate 20, a perfect TCE match for the chip is provided, and leaving it in place after test and/or burn-in provides a solution for the ever growing real-estate size of chips and I/O connections, such as C4s. It even provides additional enhancement possibilities for capacitors, such as thin film capacitors and/or other surface mount devices, where de-coupling capacitance is required.

This invention further provides a glass ceramic baseplate 20 for the chip 10 during burn-in and/or testing, which acts as a structural support, and which is very important for the advanced level chips, especially the ones with low modulus inter-level dielectrics.

The ceramic through-via baseplate 20 can provide a burn-in platform, and if it also has a capacitor built into it, it can further enable accurate speed test at very high clock speeds, such as, greater than about 300 MHz.

It is preferred that the Young's modulus for the baseplate 20 is greater than about 50 GPa. It is preferred that the hardness of the baseplate 20 is greater than about 5 GPa.

This invention further allows the evaluation of future generations of semiconductor chips using new materials in the BEOL (back-end-of-line) structure. For example, currently the new chips are using copper for the metallization instead of aluminum, and therefore a whole host of new insulator materials can now being considered. In particular, materials such as polyarylene ether (PAE), silsequioxanes and many others are being evaluated to replace silica. All of these materials have lower dielectric constants than silica, so the performance of the chip will be enhanced. However, it is well known that all of these materials are mechanically very weak. This problem can be further exacerbated when porous materials are used, which have even lower dielectric constants. In fact they are typically an order of magnitude lower in modulus and hardness than silica. Consequently, chips made with low dielectric constant materials between the conductors have not been very successful in the internal poly/metallization levels (back-end-of-line (BEOL) layers). To prevent these problems, this invention can be used to attach such chips to at least one baseplate, such as a glass ceramic baseplate, which is matched in TCE to the silicon and which will alleviate the stress-cracking problems that arise due to TCE mismatch issues.

Therefore, in this invention, chips can be mounted to a glass ceramic (or other ceramic material which has a TCE close to that of silicon) baseplate during the initial process of test and burn-in, and then the chips can be left on the custom baseplate. This baseplate could be a glass ceramic piece with copper thru vias for the lowest cost applications or alternatively could be made with some level of X-Y wiring for high end applications if desired. KGDs can then be directly attached to the final MCM, resulting in a KGM. This invention also prevents the use of any forces directly on the chip. Once the chip is attached to the baseplate, it does not have to undergo any chip removal operation.

As stated earlier, at least one capacitor may be attached on the baseplate for those applications where decoupling capacitance is required to be delivered close to the chip (low inductance and low parasitic capacitance). Additionally, any surface mount device, such as resistor or inductor, can also be joined to the baseplate, or embedded devices can be incorporated if desired.

The baseplate of this invention allows the use of low modulus, low dielectric constant BEOL (back-end-of-line) materials that will give enhanced electrical performance to the chip, because the materials that have a lower dielectric constant than $SiO_2$ are also at least an order of magnitude weaker mechanically than traditionally used $SiO_2$.

Although the preferred embodiment is a glass ceramic baseplate, this invention could be made using other ceramic baseplates that satisfy the TCE and other requirements. The baseplate could be a single layer or a multilayer baseplate.

Similarly, Ag, Al, Au, Cu, and alloys thereof, are preferred for metallization of the baseplate. However, other suitable metals and metallic materials could also be used. Similarly, the metallization could be on a single layer or on multiple layers.

It is contemplated that for some applications at least a portion of the baseplate could be or act as at least one capacitor. With at least one capacitor as an integral part of the baseplate one could get enhanced performance, especially in the area of high frequency applications, testing, and eventual field performance.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of assembling an electronic component to a substrate, said method comprising the steps of:
   (a) forming a subassembly of the electronic component joined to a baseplate;
   (b) temporarily joining said subassembly to a test apparatus to test the electronic component, wherein said subassembly is joined to said test apparatus by at least one I/O connection on said baseplate;
   (c) removing said subassembly from said test apparatus; and
   (d) joining said subassembly to a substrate if said electronic component is good, wherein said subassembly is joined to said substrate by said at least one I/O connection on said baseplate.

2. The method of claim 1, wherein said electronic component is joined to said baseplate by at least one I/O connection selected from a group consisting of C4, solder ball, solder pad and solder column.

3. The method of claim 1, wherein said at least one I/O connection on said baseplate is selected from a group consisting of C4, solder ball, solder pad and solder column.

4. The method of claim 1, wherein said baseplate is selected from a group consisting of ceramic, glass ceramic and material with a thermal coefficient of expansion of about $3 \times 10^{-6}/°C$.

5. The method of claim 1, wherein said baseplate has at least one layer of metallization selected from a group consisting of Al, Ag, Au, Cu and alloys thereof.

6. The method of claim 1, wherein said baseplate comprises at least one capacitor.

7. The method of claim 1, wherein said electronic component is selected from a group consisting of chip, capacitor, resistor and surface mount component.

8. The method of claim 1, wherein Youngs modulus for said baseplate is greater than about 50 GPa.

9. The method of claim 1, wherein hardness for said baseplate is greater than about 5 GPa.

10. The method of claim 1, wherein said substrate is selected from a group consisting of ceramic, glass ceramic and material with a thermal coefficient of expansion of about $3 \times 10^{-6}/°C$.

11. The method of claim 1, wherein said substrate has at least one I/O connection selected from a group consisting of C4, pad, pin, wire, solder ball, solder pad and solder column.

12. The method of claim 1, wherein said baseplate has a dielectric constant of less than about 4.0.

13. The method of claim 1, wherein said subassembly is removed from said test apparatus by shearing said at least one I/O connection on said baseplate.

* * * * *